United States Patent
Lin et al.

(10) Patent No.: US 8,375,584 B2
(45) Date of Patent: Feb. 19, 2013

(54) METHOD FOR MANUFACTURING LARGE-AREA HEAT SINK HAVING HEAT-DISSIPATING FINS

(75) Inventors: Kuo-Len Lin, Wugu Township, Taipei County (TW); Chen-Hsiang Lin, Wugu Township, Taipei County (TW); Ken Hsu, Wugu Township, Taipei County (TW); Chih-Hung Cheng, Wugu Township, Taipei County (TW)

(73) Assignees: Cpumate Inc, New Taipei (TW); Golden Sun News Techniques Co., Ltd., New Taipei (TW)

( * ) Notice: Subject to any disclaimer, the term of this patent is extended or adjusted under 35 U.S.C. 154(b) by 709 days.

(21) Appl. No.: 12/511,184

(22) Filed: Jul. 29, 2009

(65) Prior Publication Data
US 2011/0024087 A1 Feb. 3, 2011

(51) Int. Cl.
*B21D 53/06* (2006.01)
(52) U.S. Cl. ......... 29/890.046; 29/890.045; 29/890.047; 29/890.04; 165/104.26; 165/185; 165/80.3
(58) Field of Classification Search ............. 165/104.26, 165/185, 80.3; 29/890.03, 890.032, 890.039, 29/890.04, 890.045, 890.046, 890.047; 361/697, 361/704, 710
See application file for complete search history.

(56) References Cited

U.S. PATENT DOCUMENTS

| | | | | | |
|---|---|---|---|---|---|
| 2,119,761 | A | * | 6/1938 | Wentworth | 165/150 |
| 2,994,123 | A | * | 8/1961 | Kritzer | 29/890.047 |
| 3,223,153 | A | * | 12/1965 | Simpelaar | 165/152 |
| 3,241,610 | A | * | 3/1966 | Kritzer | 165/182 |
| 3,407,874 | A | * | 10/1968 | Gier, Jr. | 165/151 |
| 3,852,806 | A | * | 12/1974 | Corman et al. | 257/715 |
| 4,067,384 | A | * | 1/1978 | Miyakawa | 165/151 |
| 4,755,249 | A | * | 7/1988 | DeGree et al. | 156/252 |
| 4,881,311 | A | * | 11/1989 | Paulman et al. | 29/890.047 |
| 5,732,768 | A | * | 3/1998 | Fraulo | 165/151 |
| 6,340,056 | B1 | * | 1/2002 | Huang et al. | 165/185 |
| 6,575,229 | B1 | * | 6/2003 | Taban | 165/80.3 |
| 7,273,094 | B2 | * | 9/2007 | Lin | 165/182 |
| 2003/0094273 | A1 | * | 5/2003 | Toth et al. | 165/183 |
| 2010/0218915 | A1 | * | 9/2010 | Chen | 165/80.3 |
| 2011/0024089 | A1 | * | 2/2011 | Lin et al. | 165/104.26 |

* cited by examiner

*Primary Examiner* — David Bryant
*Assistant Examiner* — Jacob Cigna
(74) *Attorney, Agent, or Firm* — Chun-Ming Shih; HDLS IPR Services

(57) ABSTRACT

The present invention relates to a heat sink of a large area, in which a heat-dissipating body is further provided in its limited space. The method for manufacturing a fin includes the steps of providing a fin, cutting the fin to form a foldable piece thereon, folding back the foldable piece to be overlapped on the fin and form an accommodating hole, and punching the folded piece and the fin to form two overlapped throughholes. The fin, the heat-dissipating body and heat pipes are assembled together to obtain the heat sink. Since the fins and the heat-dissipating body dissipate the heat of the heat-generating element simultaneously, the heat-dissipating efficiency of the heat sink can be improved.

10 Claims, 10 Drawing Sheets

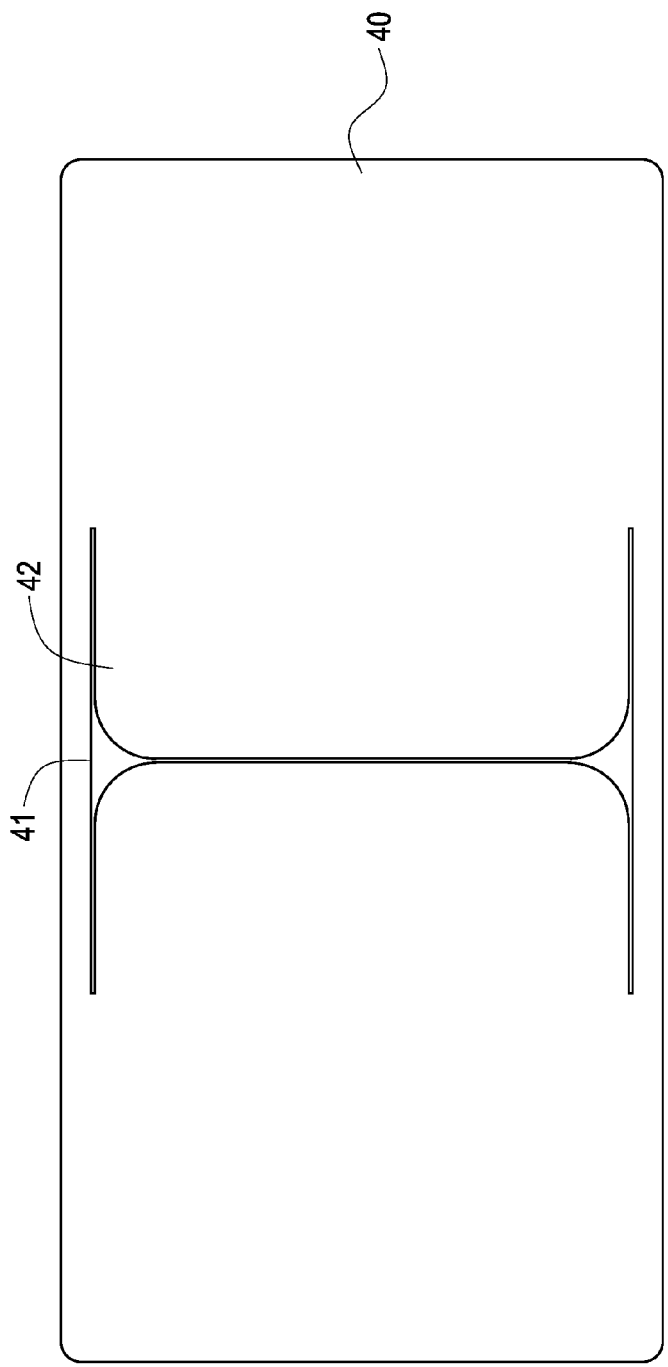
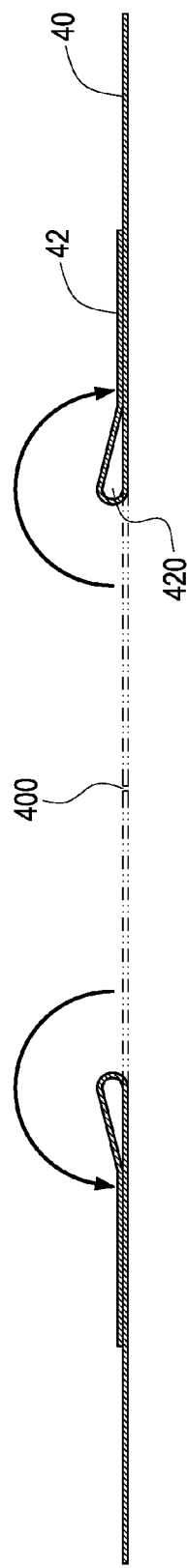
FIG.4A
FIG.4B

METHOD FOR MANUFACTURING LARGE-AREA HEAT SINK HAVING HEAT-DISSIPATING FINS

BACKGROUND OF THE INVENTION

1. Field of the Invention

The present invention relates to a heat sink, and in particular to a heat sink of a large area.

2. Description of Prior Art

Electronic elements will generate heat during their operations. Especially, with the advancement of the science and technology, the functions and performance of an electronic product are enhanced substantially. As a result, the heat generated by the electronic product also increases to a much larger extent. In view of this, most of the electronic elements are provided with a heat sink to control its working temperature and maintain its normal operation. It is a well-known heat sink including a stack of heat-dissipating fins and heat pipes penetrating the stack of heat-dissipating fins.

Please refer to FIG. 1, which is a schematic view showing the conventional combination of heat pipes and heat-dissipating fins. The heat sink 1a comprises a heat-conducting base 10a, two U-shaped heat pipes 20a and a plurality of fins 30a. The heat-conducting base 10a is provided with a plurality of grooves 11a. The two U-shaped heat pipes 20a are inserted into the grooves 11a. The heat pipe 20a penetrates through-holes of the plurality of fins 30a. With this arrangement, the heat-conducting base 10a is adhered to a heat-generating element. The heat sink 1a can conduct the heat generated by the heat-generating electronic element quickly.

In the above structure, the heat is conducted from the heat pipe 20a to the fins 30a. Then, the fins 30a dissipate the heat quickly to the outside. However, the heat pipes 20a cannot conduct the heat uniformly throughout the fins 30a, so that the portions away from the heat pipe 10a are poor in heat-dissipating efficiency. Moreover, with the continuous improvement in the performance of electronic elements, the heat generated by the electronic elements is increased accordingly. Thus, the heat-dissipating efficiency of the heat sink also has to be improved. Due to the limited volume of the current electronic product, it is an important issue to increase the heat-dissipating area of the heat sink 1a as large as possible in order to increase the heat-dissipating efficiency.

Therefore, in order to solve the above-mentioned problems, the present Inventor proposes a reasonable and novel structure based on his deliberate research and expert experiences.

SUMMARY OF THE INVENTION

The present invention is to provide a fin and a heat sink of a large area. A heat-dissipating body is further provided in a limited space, so that the fins and the heat-dissipating body can dissipate the heat of a heat-generating element. In this way, the heat-dissipating efficiency can be enhanced.

The present invention is to provide a method for manufacturing a heat sink of a large area, which includes the steps of: a) providing a plurality of fins and a heat pipe; b) cutting each of the fins to form a plurality of cutting lines on the fin, the cutting lines forming at least one foldable piece; c) folding the foldable piece back to be overlapped on the fin, thereby forming an accommodating hole on the fin; d) punching the fin and the folded piece to form two overlapped through-holes; e) penetrating the two through-holes of the fin and the folded piece by the heat pipe; and f) penetrating other fins by the heat pipe according to the step e).

The present invention provides a heat sink of a large area, which includes a heat pipe and a plurality of fins. The fins are parallel to each other and arranged at intervals. The heat pipe penetrates the fins. Each of the fins is provided with a foldable piece. The foldable piece is folded back to be overlapped on the fin. The fin is formed with an accommodating hole. The folded piece and the fin are provided with two overlapped through-holes. The heat pipe penetrates the two through-holes of the fins.

The present invention provides a heat-dissipating fin. The fin is provided with a foldable piece. The foldable piece is folded back to be overlapped on the fin, thereby forming an accommodating hole on the fin. The folded piece and the fin are provided with two overlapped through-holes.

In comparison with prior art, since the fin of the present invention is provided with a folded piece and an accommodating hole, in case of a limited space, the present invention does not need additional space for arranging the fins. Not only the heat sink has a plurality of fins, but also a heat-dissipating body can be further disposed in the accommodating holes of the fins. The heat sink of the present invention has a larger heat-dissipating area than that in prior art. Since the fins and the heat-dissipating body dissipate the heat of the heat-generating element simultaneously, the heat-dissipating efficiency of the heat sink can be increased. Thus, the practicability of the present invention can be increased.

BRIEF DESCRIPTION OF THE DRAWINGS

FIG. 4A is a view showing the action for cutting the fin of the present invention;

FIG. 4B is a view showing the action for folding back the foldable piece of the fin according to the present invention;

DETAILED DESCRIPTION OF THE INVENTION

The characteristics and technical contents of the present invention will be described with reference to the accompanying drawings. However, the drawings are illustrative only but not used to limit the present invention.

Figure 1:
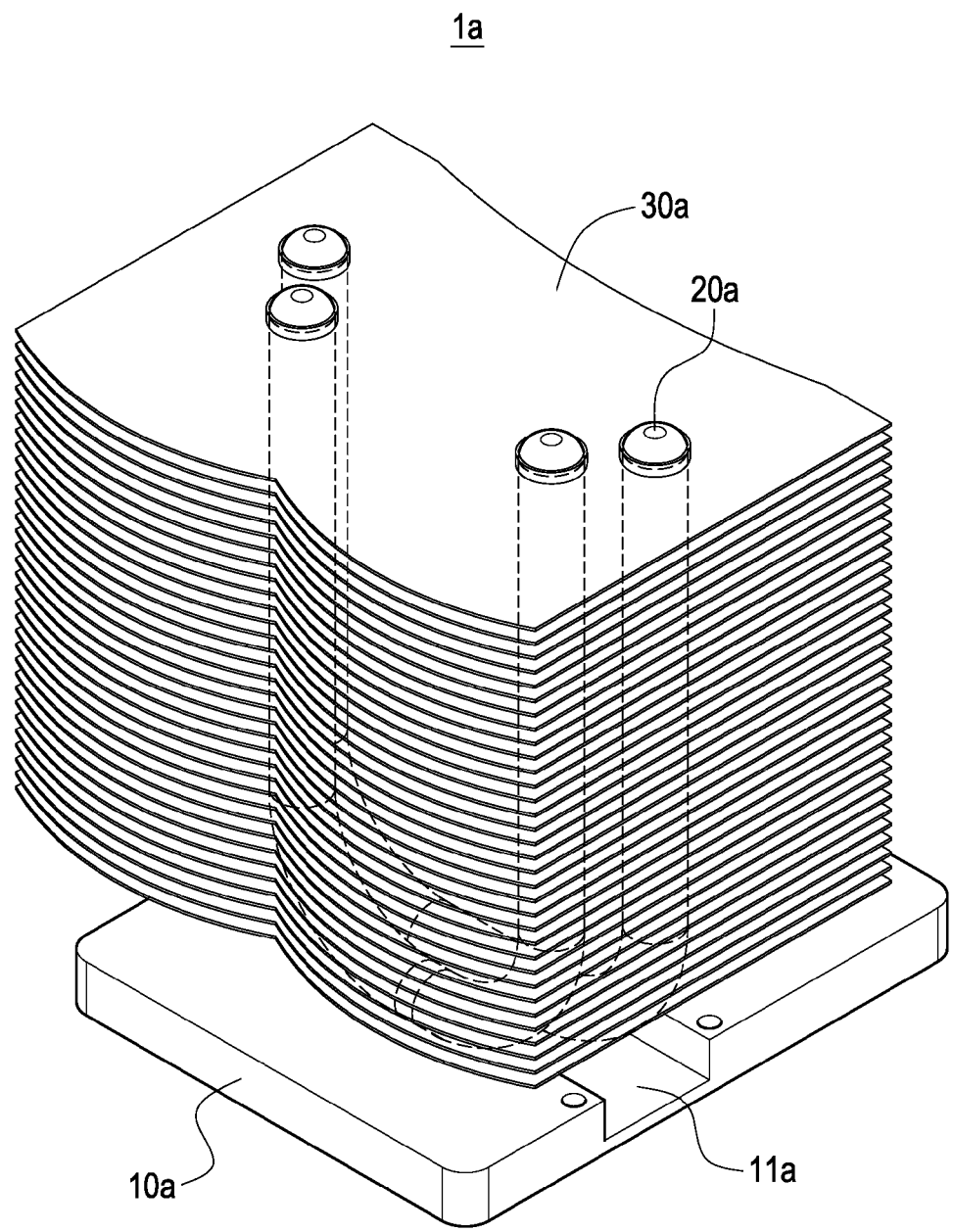
FIG. 1 is a schematic view showing the conventional combination of heat pipes and heat-dissipating fins.
Figure 2:
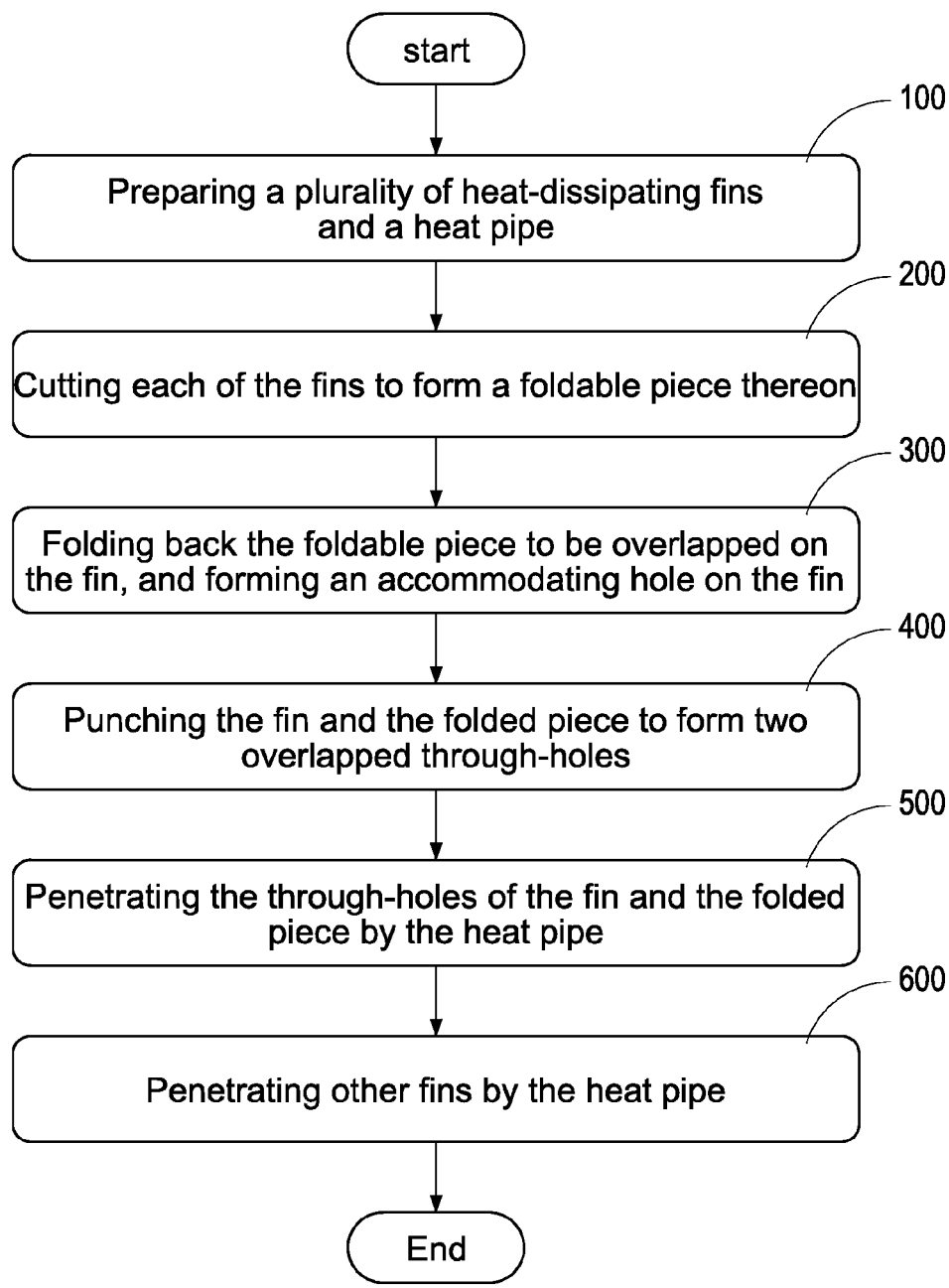
FIG. 2 is a flow chart showing the method for manufacturing the heat sink of a large area according to the present invention.
Figure 3:
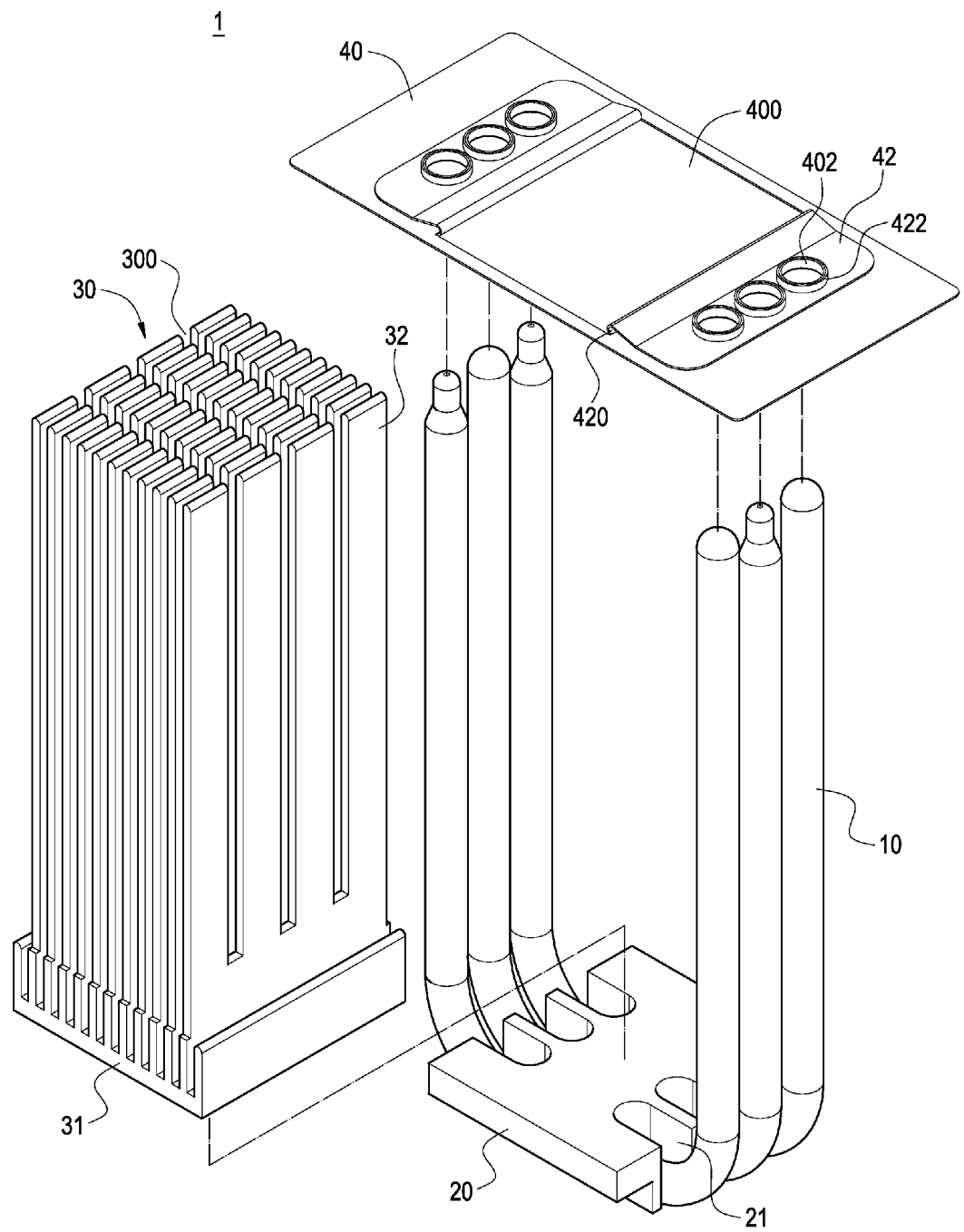
FIG. 3 is an assembled view showing the heat sink of a large area according to the present invention.
Figure 4C:
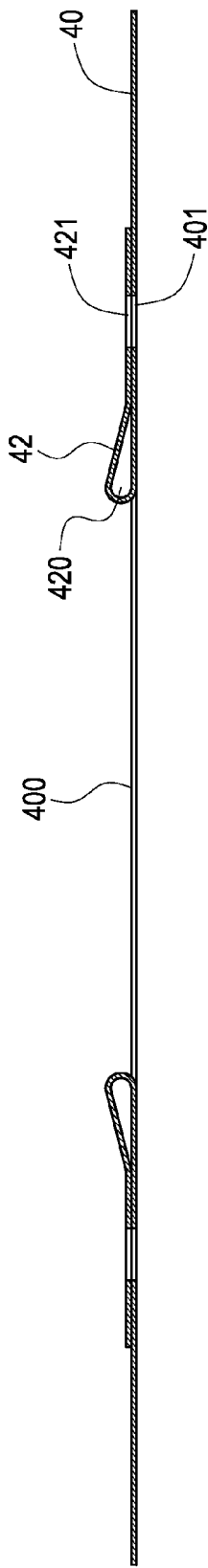
FIG. 4C is a view showing the action for punching the fin and the folded piece according to the present invention.
Figure 4D:
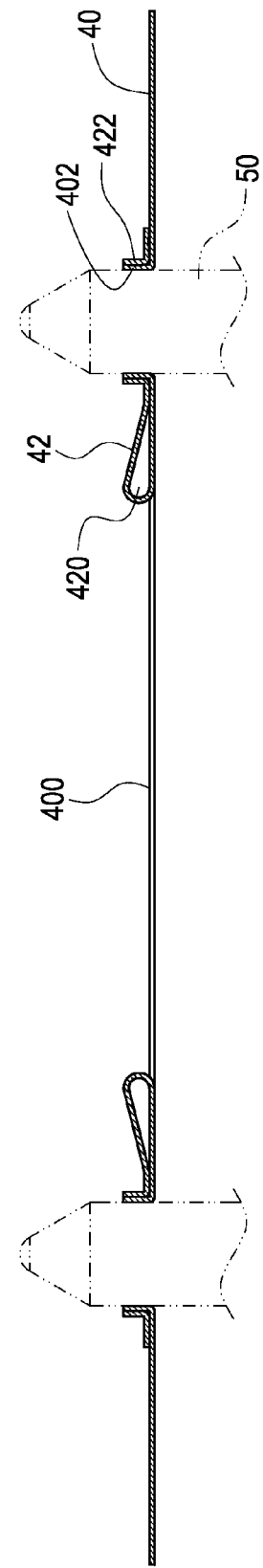
FIG. 4D is a view showing the action for pressing the fin and the folded piece according to the present invention.

Please refer to FIGS. 2 and 3. FIG. 2 is a flow chart showing the method for manufacturing the heat sink of a large area according to the present invention, and FIG. 3 is an assembled view showing the heat sink of a large area according to the present invention. First, a heat pipe 10, a heat-conducting base 20, a heat-dissipating body 30 and a plurality of fins 40 are provided (step 100). The heat pipe 10 penetrates the heat-conducting base 20.

In the present embodiment, there are three heat pipes 10 each formed into a U shape, but the number of the heat pipes 10 is not limited thereto. The bottom surface of the heat-conducting base 20 is provided with three grooves 21 to correspond to the number of the heat pipes 10. The three heat pipes 10 are inserted into the grooves 21. The heat-dissipating body 30 is an aluminum-extruded fin which has a base 31 and a plurality of extending pieces 32 extending upwards from the base 31. The extending pieces 32 are parallel to each other and arranged at intervals. A channel 300 is formed between any two extending pieces 32. Further, the fins 40 are penetrated by the heat pipe 10.

Please refer to FIGS. 4A to 4D, which show the method for manufacturing the fin 40. First, a tool (not shown) is used to cut the fin 40 (step 200) so as to form a plurality of cutting lines 41 on the fin 40. The cutting lines 41 form at least one foldable piece 42 on the fin 40. For example, if the cutting lines 41 forms a U shape, one foldable piece 42 can be formed on the fin 41. If the cutting lines 41 formed an H shape, both sides of the fin 40 can generate a foldable piece 42 respectively.

Please refer to FIG. 4B. Then, the foldable piece 42 is folded back, so that the folded piece 42 can be overlapped on the fin 40. A hollow airflow channel 420 is formed between the folded piece 42 and the fin 40. The hollow airflow channel 420 allows airflow to flow through to take away the heat. As a result, the fin 40 is formed with an accommodating hole 400 (step 300). Then, the fin 40 and the folded piece 42 are punched to form two overlapped through-holes 401, 402 (step 400). In the present embodiment, the step 400 is performed after the step 300. That is, in the present embodiment, the fin 40 and the folded piece 42 overlapped on the fin 40 are punched at the same time. Alternatively, the step 400 can be performed before the step 300. That is, in the step 400, the fin 40 and the foldable piece 42 are first punched to form two overlapped through-holes 401, 402. Then, the step 300 is performed. The foldable piece 42 is folded back to be overlapped on the fin 40, so that the two through-holes 401, 402 are overlapped. Then, a tool 50 is used to press the peripheries of the two through-holes 401, 421. In this way, the peripheries of the two through-holes 401, 421 are formed with two overlapped flanges 402, 422.

The two through-holes 401, 422 of the fin 40 and the folded piece 42 are aligned with the heat pipe 10, so that the fin 40 and the folded piece 42 can be penetrated by the heat pipe 10 (step 500). The base 31 of the heat-dissipating body 30 is disposed on the top surface of the heat-conducting base 20 and is accommodated in the accommodating hole 400 of the fin 40.

Figure 5:
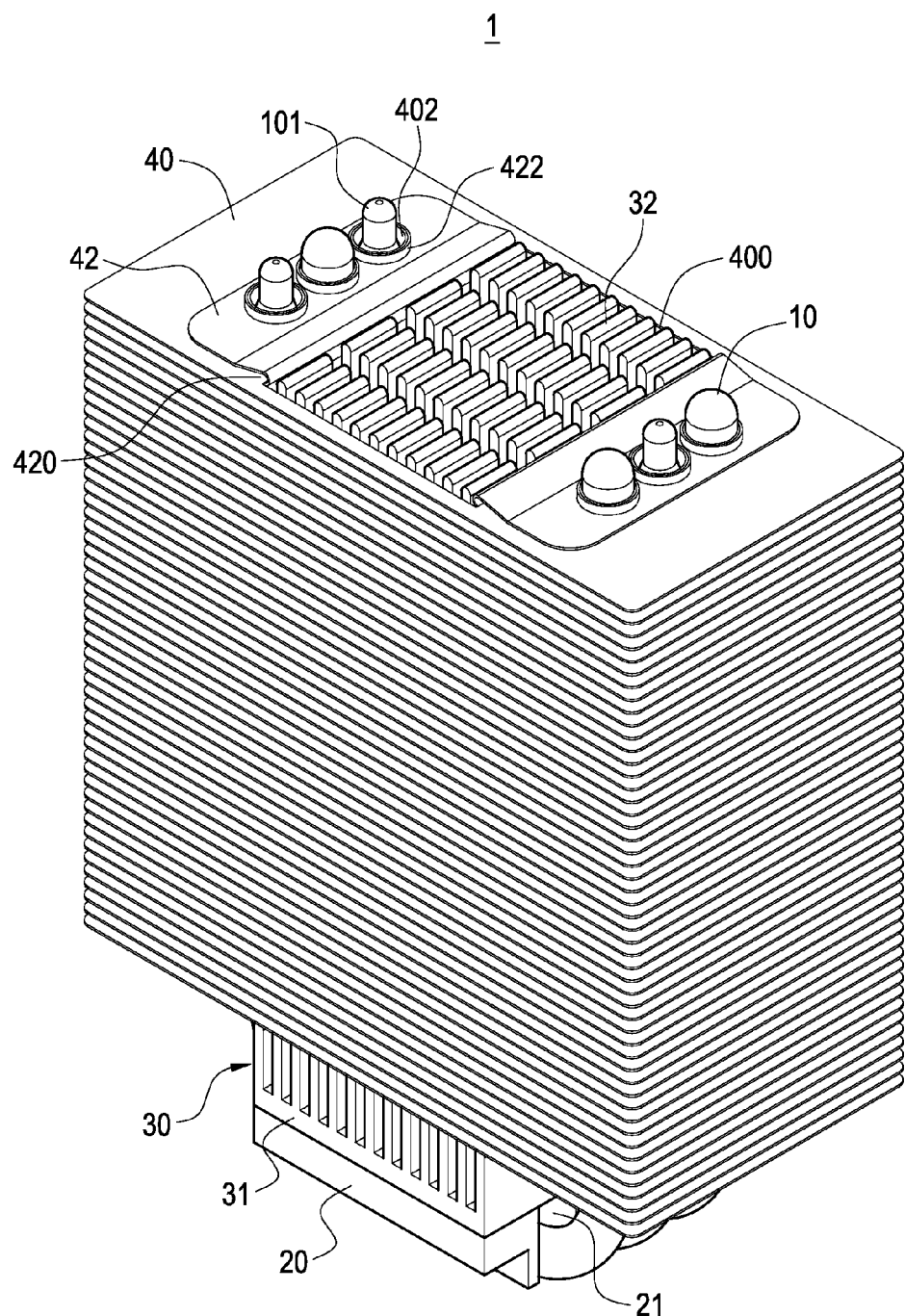
FIG. 5 is a perspective view showing the external appearance of the heat sink of the present invention.
Figure 6:
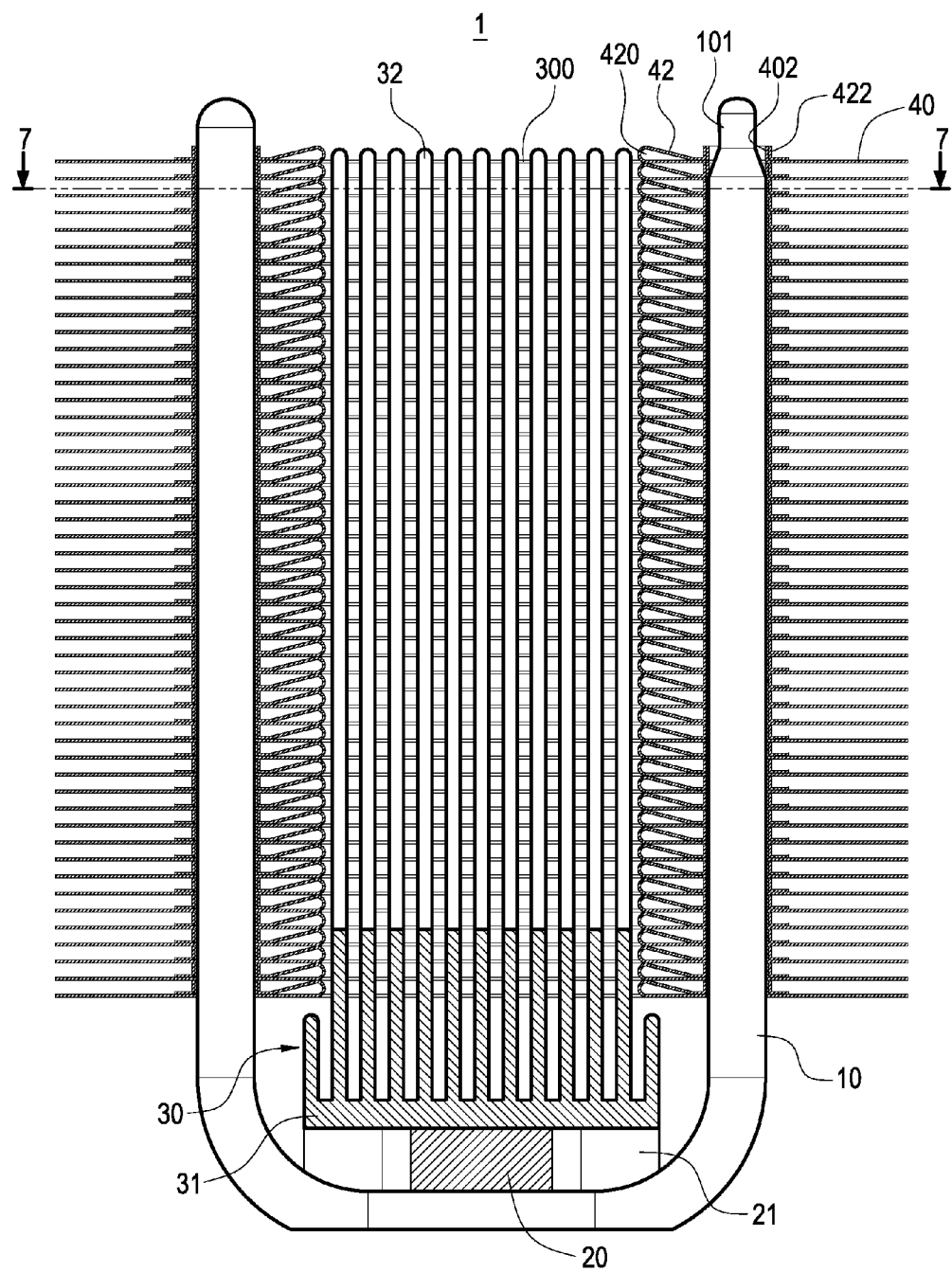
FIG. 6 is a longitudinal cross-sectional view showing the heat sink of the present invention.
Figure 7:
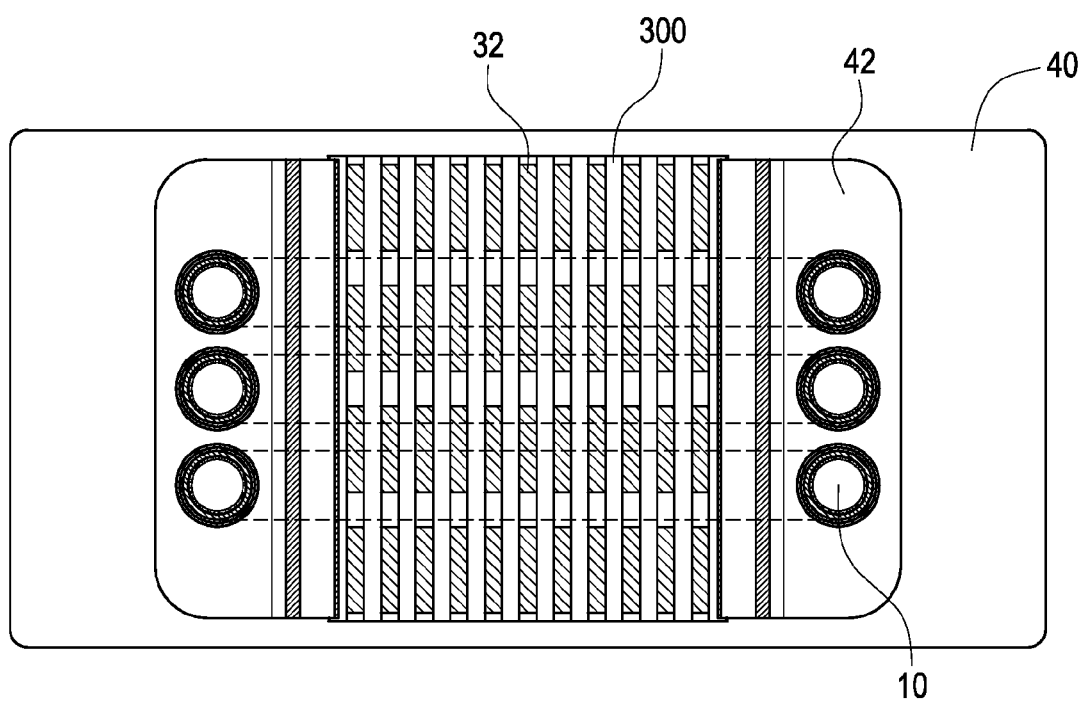
FIG. 7 is a transverse cross-sectional view showing the heat sink of the present invention.

Please refer to FIGS. 5 to 7. FIG. 5 is a perspective view showing the external appearance of the heat sink of the present invention. FIG. 6 and FIG. 7 are cross-sectional views of the present invention respectively. Following the above steps, other fins can be penetrated by the heat pipe 10 (step 600), thereby completing a heat sink 1. It can be seen that the flange 402 of the through-hole 401 of the fin 40 is adhered to an outer wall of the heat pipe 10 tightly (excluding a narrowed section 101 of the heat pipe 10). Most of the extending pieces 32 of the heat-dissipating body 30 are accommodated in the accommodating holes 400 of a stack of fins 40. In addition, the channels 300 of the heat-dissipating body 20 are in communication with each other.

Figure 8:
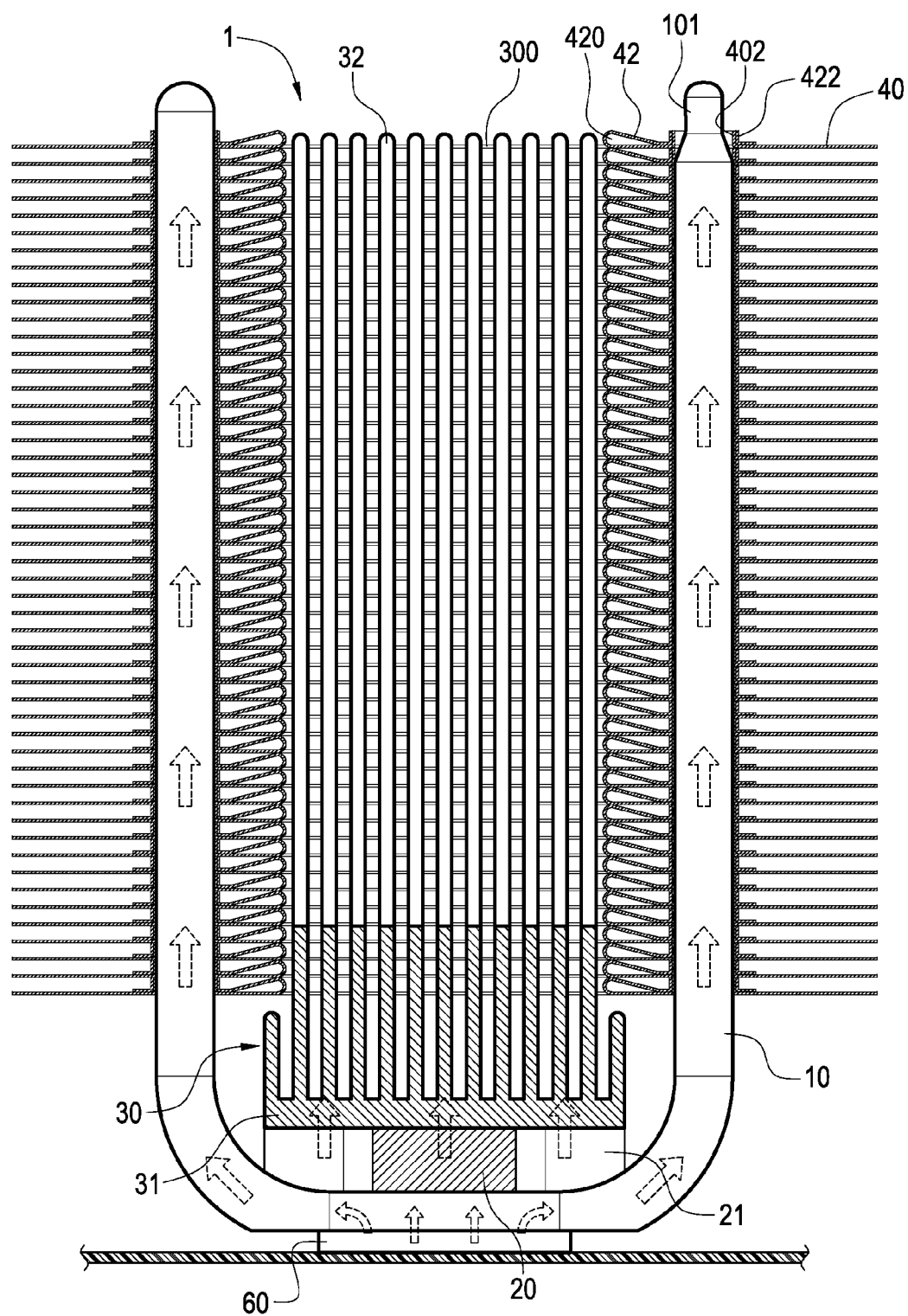
FIG. 8 is a schematic view showing the operating state of the heat sink of the present invention.

Please refer to FIG. 8, which is a schematic view showing the operating state of the heat sink of a large area according to the present invention. When the heat sink 1 is used to dissipate the heat of a heat-generating electronic element 60, the heat-conducting base 20 and the bottom section of the heat pipe 10 are adhered to the surface of the heat-generating electronic element 60. The heat generated by the heat-generating electronic element 60 is conducted to the heat-conducting base 20 and the heat pipe 10. The heat is further conducted to the fins 40 by means of the heat pipe 10. On the other hand, the heat conducted to the heat-conducting base 20 is further conducted to the heat-dissipating body 30. As a result, the extending pieces 32 dissipate the heat into the channels 300 that are in communication with each other. The fins 40 and the heat-dissipating body 30 are used to dissipate the heat of the heat-generating electronic element 60 at the same time to the outside. In this way, the temperature of the heat-generating electronic element 60 can be reduced, and the accumulation of heat on the heat-generating electronic element 60 can be prevented. Thus, the heat-dissipating efficiency of the heat sink 1 is increased.

Figure 9:
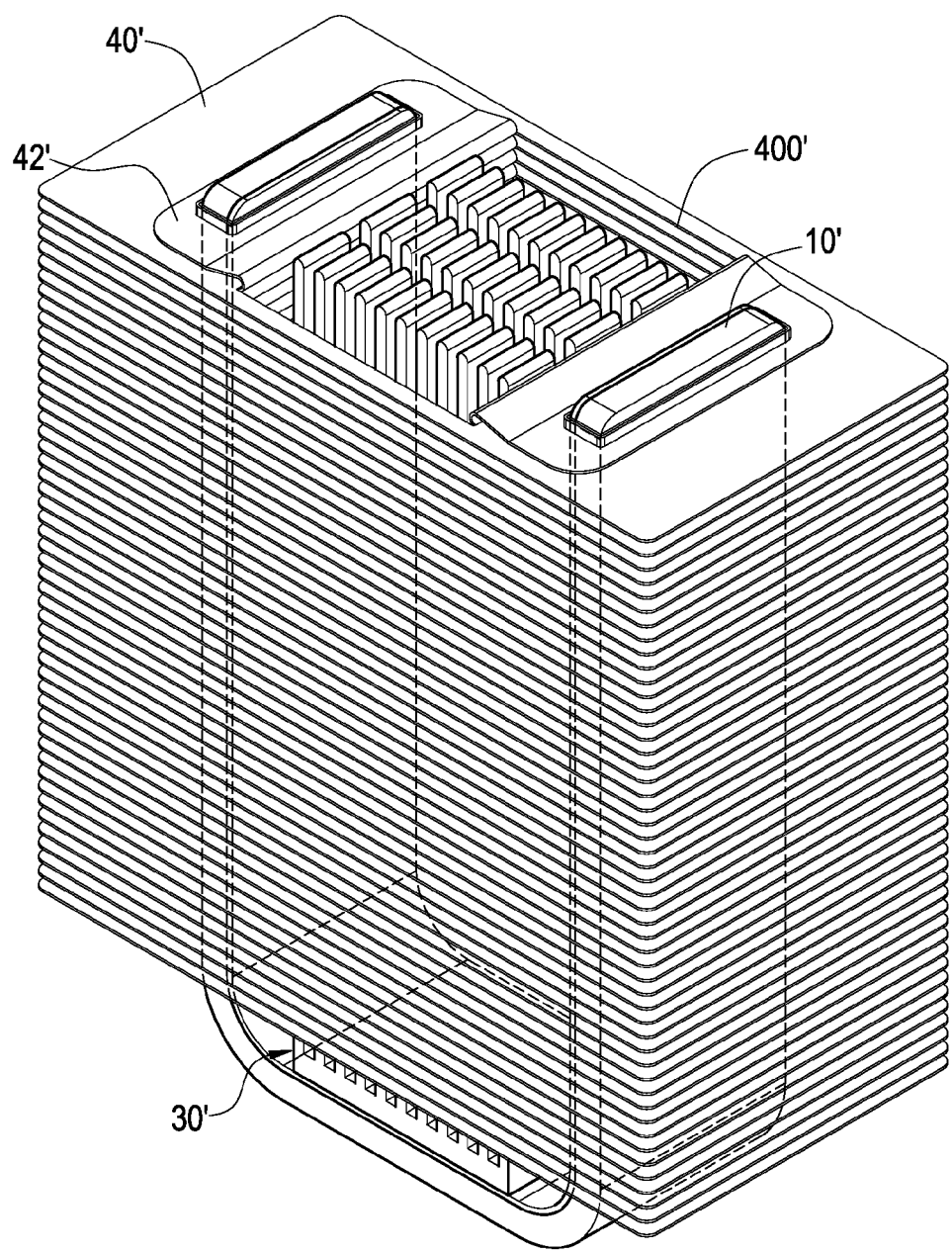
FIG. 9 is a view showing the heat sink according to the second embodiment of the present invention.

Please refer to FIG. 9, which is a view showing the heat sink of a large area according to the second embodiment of the present invention. The present embodiment is substantially the same as the first embodiment. The difference between the present embodiment and the first embodiment is described as follows. The heat sink 1' is not provided with a heat-conducting base. The fins 40' are penetrated by a flat heat pipe 10'. Each of the fins 40' is provided with two foldable pieces 42' and an accommodating hole 400' is formed between the two foldable pieces 42'. A heat-dissipating body 30' is also accommodated in the accommodating hole 400'.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method for manufacturing a heat sink of a large area, comprising the steps of:
   a) providing a plurality of fins and a heat pipe;
   b) cutting each of the fins to form a plurality of cutting lines on each fin, the cutting lines forming at least one foldable piece on each fin;
   c) folding back the foldable piece on each fin to be overlapped on that fin, thereby forming a folded piece and an accommodating hole on that fin;
   d) punching each fin and each folded piece to form two overlapped through-holes;
   e) penetrating the two through-holes and the folded piece of one fin by the heat pipe; and
   f) penetrating the remainder of the other fins by the heat pipe according to the step e).

2. The method for manufacturing a heat sink of a large area according to claim 1, wherein in the step b), the cutting lines form a U shape on each of the fins to form the foldable piece on each fin.

3. The method for manufacturing a heat sink of a large area according to claim 1, wherein in the step b), the cutting lines form an H shape on each of the fins to form two foldable pieces on the fin.

4. The method for manufacturing a heat sink of a large area according to claim 1, wherein a hollow airflow channel is formed between the folded piece and the fin in the step c).

5. The method for manufacturing a heat sink of a large area according to claim 1, wherein the step d) is performed after the step c), the foldable piece is folded back to be overlapped on the fin in the step c), and the fin and the folded piece overlapped on the fin are punched in the step d).

6. The method for manufacturing a heat sink of a large area according to claim 1, wherein the step d) is performed before the step c), the fin and the foldable piece are punched in the step d) to form two overlapped through-holes, the foldable piece is folded back to be overlapped on the fin in the step c), thereby overlapping the two through-holes.

7. The method for manufacturing a heat sink of a large area according to claim 1, further comprising, between the step d) and the step e), a step d') of pressing peripheries of the two through-holes to form two overlapped flanges on the peripheries of the two through-holes.

8. The method for manufacturing a heat sink of a large area according to claim 7, wherein the flange of each through-hole of the fin is adhered to an outer wall of the heat pipe in the step f).

9. The method for manufacturing a heat sink of a large area according to claim 1, further comprising a step h) of providing a heat-conducting base, the heat pipe being inserted into the heat-conducting base.

10. The method for manufacturing a heat sink of a large area according to claim 1, further comprising a step g) of providing a heat-dissipating body, the heat-dissipating body being accommodated in the accommodating hole of each fin.

* * * * *